US010348252B2

(12) United States Patent
Jeong et al.

(10) Patent No.: US 10,348,252 B2
(45) Date of Patent: Jul. 9, 2019

(54) AMPLIFIER CIRCUIT

(71) Applicants: SK hynix Inc., Gyeonggi-do (KR);
Seoul National University R&DB Foundation, Seoul (KR)

(72) Inventors: Deog-Kyoon Jeong, Seoul (KR); Jung Min Yoon, Seoul (KR)

(73) Assignees: SK hynix Inc., Gyeonggi-do (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 15/941,173

(22) Filed: Mar. 30, 2018

(65) Prior Publication Data

US 2019/0007000 A1    Jan. 3, 2019

(30) Foreign Application Priority Data

Jun. 28, 2017   (KR) .................. 10-2017-0081820

(51) Int. Cl.
*G11C 7/00*        (2006.01)
*H03F 1/30*        (2006.01)
(Continued)

(52) U.S. Cl.
CPC ............ *H03F 1/301* (2013.01); *G11C 7/065* (2013.01); *G11C 11/4091* (2013.01);
(Continued)

(58) Field of Classification Search
CPC ............ G11C 13/004; G11C 11/4091; G11C 2207/002; G11C 2207/065; G11C 29/34; G11C 7/1006

See application file for complete search history.

(56) References Cited

U.S. PATENT DOCUMENTS 6,307,424 B1 *  10/2001  Lee .................... H03K 19/0005
                                                           326/30
2003/0081479 A1 *  5/2003  Matsumoto .......... G11C 7/1006
                                                           365/201
(Continued)

FOREIGN PATENT DOCUMENTS

KR     1020110001784     1/2011
KR     1020160069147     6/2016

OTHER PUBLICATIONS

Park, J. et al., Inverted bit-line sense amplifier with offset-cancellation capability, Electronics Letters, vol. 52 No. 9, Apr. 28, 2016.

(Continued)

*Primary Examiner* — Tuan T Nguyen
(74) *Attorney, Agent, or Firm* — IP & T Group LLP

(57) ABSTRACT

An amplifier circuit includes: a first inverter and a second inverter coupled in a cross-coupled form during an amplification operation and suitable for amplifying a voltage difference between a first line and a second line; a first isolation switch suitable for electrically connecting the first line and an output terminal of the first inverter to each other; a second isolation switch suitable for electrically connecting the second line and an output terminal of the second inverter to each other; and an equalizing switch suitable for electrically connecting the output terminal of the first inverter and the output terminal of the second inverter to each other, wherein before the amplification operation, a first offset compensation operation for turning on the second isolation switch and the equalizing switch and a second offset compensation operation for turning on the first isolation switch and the equalizing switch are performed.

19 Claims, 8 Drawing Sheets

(51) Int. Cl.
  *H03F 1/02*      (2006.01)
  *H03F 3/45*      (2006.01)
  *G11C 11/4091*   (2006.01)
  *G11C 11/4096*   (2006.01)
  *G11C 11/4094*   (2006.01)
  *G11C 7/06*      (2006.01)

(52) U.S. Cl.
  CPC ...... *G11C 11/4094* (2013.01); *G11C 11/4096* (2013.01); *H03F 1/0205* (2013.01); *H03F 3/45179* (2013.01); *H03F 3/45744* (2013.01); *H03F 2200/375* (2013.01); *H03F 2200/87* (2013.01); *H03F 2203/45018* (2013.01)

(56) References Cited

U.S. PATENT DOCUMENTS

| | | | | |
|---|---|---|---|---|
| 2004/0145956 A1* | 7/2004 | Kono | ........ | G11C 11/4091 |
| | | | | 365/205 |
| 2013/0028014 A1* | 1/2013 | Guo | ........ | G11C 7/062 |
| | | | | 365/163 |
| 2014/0003129 A1* | 1/2014 | Rho | ........ | G11C 13/004 |
| | | | | 365/148 |

OTHER PUBLICATIONS

Moon, J. et al., Sense Amplifier with Offset Mismatch Calibration for Sub 1-V DRAM Core Operation, IEEE, pp. 3501-3504, 2010.

\* cited by examiner

AMPLIFIER CIRCUIT

CROSS-REFERENCE TO RELATED APPLICATIONS

The present application claims priority to Korean Patent Application No. 10-2017-0081820, filed on Jun. 28, 2017, which is incorporated herein by reference in its entirety.

BACKGROUND

1. Field

Exemplary embodiments of the present invention relate to a circuit designing technology. Particularly, exemplary embodiments relate to an amplifier circuit for amplifying a voltage difference between two electrical lines.

2. Description of the Related Art

In general, an integrated circuit may be fabricated by forming devices such as MOS transistors on a substrate. As the size of fabricated integrated circuits shrinks, it becomes more difficult to control the processes that decide the characteristics of electronic components such as transistors, which tends to increase the performance variation of the transistors based on process skews and changes in the process, voltage, and temperature (PVT). In particular, the process skews exist even among the transistors that are fabricated concurrently in the same wafer under the same fabrication environments.

In addition, integrated circuits are designed to consume less power than before. Therefore, signals of smaller amplitudes may have to be processed accurately in integrated circuits. However, the process skew or offset among the transistors may negatively affect the reliability of the integrated circuits remarkably. For example, mismatches between the transistors that constitute an amplifier may prevent the amplifier from sensing subtle signals. Therefore, there is a need for compensating for the mismatch between the transistors.

SUMMARY

Embodiments of the present invention are directed to an amplifier circuit that may operate with a small offset value.

In accordance with an embodiment of the present invention, an amplifier circuit includes: a first inverter and a second inverter coupled in a cross-coupled form during an amplification operation and suitable for amplifying a voltage difference between a first line and a second line; a first isolation switch suitable for electrically connecting the first line and an output terminal of the first inverter to each other; a second isolation switch suitable for electrically connecting the second line and an output terminal of the second inverter to each other; and an equalizing switch suitable for electrically connecting the output terminal of the first inverter and the output terminal of the second inverter to each other, wherein before the amplification operation, a first offset compensation operation for turning on the second isolation switch and the equalizing switch and a second offset compensation operation for turning on the first isolation switch and the equalizing switch are performed. The first inverter may be enabled and the second inverter may be disabled during the first offset compensation operation, and wherein the second inverter is enabled, and the first inverter is disabled during the second offset compensation operation.

Before the first offset compensation operation and the second offset compensation operation, a pre-charge operation in which the first inverter and the second inverter are disabled and in which the first isolation switch, the second isolation switch, and the equalizing switch is turned on may be performed.

During the amplification operation, the first inverter and the second inverter may be enabled, and the first isolation switch and the second isolation switch may be turned on.

The amplifier circuit may be a bit line sense amplifier, and the first line may be a bit line, and the second line may be a bit line bar.

Before the amplification operation is performed and after the first offset compensation operation and the second offset compensation operation are performed, a charge sharing operation where data of a selected memory cell is transferred through either one of the bit line and the bit line bar may be performed.

During the charge sharing operation, the first inverter and the second inverter are disabled, and the first isolation switch, the second isolation switch, and the equalizing switch may be turned off.

Each of the first inverter and the second inverter may be enabled upon receipt of a pull-up voltage and a pull-down voltage, and disabled when one or more of the pull-up voltage and the pull-down voltage are cut off.

The amplifier circuit may further include: a first pull-up switch suitable for supplying the pull-up voltage to the first inverter; a first pull-down switch suitable for supplying the pull-down voltage to the first inverter; a second pull-up switch suitable for supplying the pull-up voltage to the second inverter; and a second pull-down switch suitable for supplying the pull-down voltage to the second inverter, wherein when the first pull-up switch and the first pull-down switch are turned on, the first inverter is enabled, and when the second pull-up switch and the second pull-down switch are turned on, the second inverter is enabled.

The amplifier circuit may further include: a pull-up switch suitable for supplying the pull-up voltage to the first inverter and the second inverter; a first pull-down switch suitable for supplying the pull-down voltage to the first inverter; and a second pull-down switch suitable for supplying the pull-down voltage to the second inverter, wherein when the pull-up switch and the first pull-down switch are turned on, the first inverter is enabled, and when the pull-up switch and the second pull-down switch are turned on, the second inverter is enabled.

The amplifier circuit may further include: a first pull-up switch suitable for supplying the pull-up voltage to the first inverter; a second pull-up switch suitable for supplying the pull-up voltage to the second inverter; and a pull-down switch suitable for supplying the pull-down voltage to the first inverter and the second inverter, wherein when the first pull-up switch and the pull-down switch are turned on, the first inverter is enabled, and when the second pull-up switch and the pull-down switch are turned on, the second inverter is enabled.

In accordance with another embodiment of the present invention, an amplifier circuit includes: a first inverter and a second inverter coupled in a cross-coupled form during an amplification operation and suitable for amplifying a voltage difference between a first line and a second line, wherein before the amplification operation, a first offset compensation operation for electrically connecting an input terminal and an output terminal of the first inverter to the second line and a second offset compensation operation for electrically connecting an input terminal and an output terminal of the second inverter to the first line are performed.

The first inverter may be enabled during the first offset compensation operation, and the second inverter may be enabled during the second offset compensation operation.

Before the first offset compensation operation and the second offset compensation operation, a pre-charge operation where the first line and the second line are electrically connected to each other may be performed while the first inverter and the second inverter are disabled.

The first inverter and the first line may be electrically disconnected from each other during the first offset compensation operation, and the second inverter and the second line may be electrically disconnected from each other during the second offset compensation operation.

Before the amplification operation is performed after the first offset compensation operation and the second offset compensation operation are performed, a signal for amplification may be transferred through at least one line between the first line and the second line.

In accordance with yet another embodiment of the present invention, an amplifier circuit includes: a first inverter and a second inverter coupled in a cross-coupled form during an amplification operation and suitable for amplifying a voltage difference between a first line and a second line; a first isolation switch suitable for electrically connecting the first line and an output terminal of the first inverter to each other; a second isolation switch suitable for electrically connecting the second line and an output terminal of the second inverter to each other; and a first pre-charge circuit suitable for applying a pre-charge voltage to the output terminal of the first inverter and the output terminal of the second inverter and for electrically connecting the output terminal of the first inverter and the output terminal of the second inverter to each other, wherein before the amplification operation, a first offset compensation operation for turning on the second isolation switch and enabling the first pre-charge circuit and a second offset compensation operation for turning on the first isolation switch and enabling the first pre-charge circuit are performed.

The amplifier circuit may further include: a second pre-charge circuit suitable for applying the pre-charge voltage to a common pull-up terminal of the first inverter and the second inverter and a common pull-down terminal of the first inverter and the second inverter, and electrically connecting the common pull-up terminal and the common pull-down terminal to each other.

During the first offset compensation operation and the second offset compensation operation, the first inverter and the second inverter may be enabled, and the second pre-charge circuit may be enabled when the first inverter and the second inverter are disabled.

DETAILED DESCRIPTION

Figure 1:
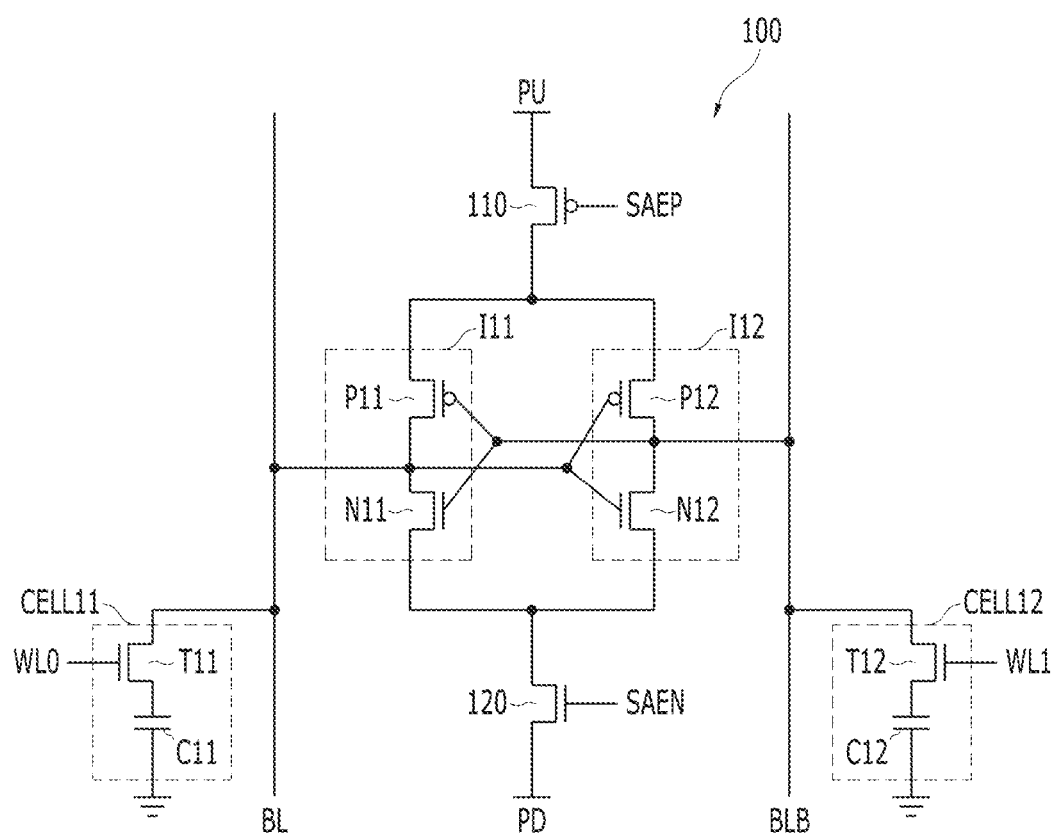
FIG. 1 is a schematic diagram illustrating a bit line sense amplifier in accordance with a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via an intervening element therebetween.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms as well, unless the context clearly indicates otherwise.

It is also noted, that in some instances, as would be apparent to those skilled in the relevant art, an element also referred to as a feature described in connection with one embodiment may be used singly or in combination with other elements of another embodiment, unless specifically indicated otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

A basic operation of a memory device may include writing a data inputted from an external device and reading a data stored in the memory device. A basic unit for storing data may be called 'a cell,' and one memory device may include one capacitor for storing one data. To read the data stored in the capacitor and exactly deliver the read data to an external device, the polarity of the data stored in the cell may have to be decided accurately. A semiconductor device may include a bit line sense amplifier (BLSA) as an amplifier circuit for deciding/amplifying data.

FIG. 1 is a schematic diagram illustrating a bit line sense amplifier 100 in accordance with a first embodiment of the present invention.

Referring to FIG. 1, the bit line sense amplifier 100 may include a first inverter I11, a second inverter I12, a pull-up voltage supplier 110, and a pull-down voltage supplier 120. For the sake of convenience in description, a memory cell CELL11 on the side of a bit line BL and a memory cell CELL12 on the side of a bit line bar BLB are illustrated along with the bit line sense amplifier 100.

In accordance with one exemplary embodiment, the first inverter I11 and the second inverter I12 may respectively include PMOS transistors P11 and P12 and NMOS transistors N11 and N12. The first inverter I11 and the second inverter I12 may be coupled in a cross-coupled form, that is, a latched form, and perform an amplifying operation.

The pull-up voltage supplier 110 may supply a pull-up voltage PU to the first inverter I11 and the second inverter I12 in response to a pull-up voltage supplying signal SAEP, and the pull-down voltage supplier 120 may supply a pull-down voltage PD to the first inverter I11 and the second inverter I12 in response to a pull-down voltage supplying signal SAEN. As for the pull-up voltage PU, a power source voltage VDD or a core voltage VCORE (obtained by down-converting the power source voltage VDD) may be used. As for the pull-down voltage PD, a ground voltage may be used.

Before the amplification operation of the bit line sense amplifier 100, the bit line BL and the bit line bar BLB, which may be referred to as a bit line pair BL and BLB, may be pre-charged with the same voltage level. When a $0^{th}$ word line WL0 is enabled, a charge sharing operation where the data stored in the capacitor C11 flows into the bit line BL through a channel of a cell transistor T11 of the memory cell CELL11 coupled to the $0^{th}$ word line WL0 may be performed. The voltage level of the bit line BL may become slightly higher or lower than the pre-charge voltage level based on the logic value of the data. Herein, the bit line bar BLB may maintain the pre-charge voltage level. In one embodiment, the pre-charge voltage level may be an intermediate level between the pull-up voltage PU and the pull-down voltage PD.

After the charge sharing operation, when the pull-down voltage supplying signal SAEN is enabled to a logic high level and the pull-up voltage supplying signal SAEP is enabled to a logic low level, the pull-up voltage PU and the pull-down voltage PD may be supplied to the first inverter I11 and the second inverter I12. In short, the first inverter I11 and the second inverter I12 may be enabled. An amplification operation begins as the first inverter I11 and the second inverter I12 are enabled. The amplification operation may be able to amplify the voltage levels of the bit line BL and the bit line bar BLB. To be specific, the amplification operation may amplify a high voltage level to be even higher and amplify a low voltage level to be even lower.

Ideally, if there is a potential difference dV between both ends of the bit line pair BL and BLB, the bit line sense amplifier 100 may be able to accurately sense and amplify the potential difference dV between both ends of the bit line pair BL and BLB, which is often not true in practice. The minimum value of the potential difference dV between both ends of the bit line pair BL and BLB that is needed for the bit line sense amplifier 100 to accurately operate is referred to as an offset voltage. When the potential difference between both ends of the bit line pair is smaller than the offset voltage, the bit line sense amplifier 100 may not accurately perform an amplification operation and a sense operation. Among the factors that cause the offset voltage as described above is a mismatch between the first inverter I11 and the second inverter I12. The PMOS transistors P11 and P12 and the NMOS transistors N11 and N12 of the first inverter I11 and the second inverter I12 in charge of the sense and amplification operations may have to be formed identically. In reality, however, a mismatch may be caused for a number of reasons: e.g., the structural layout of the inverters may not be drawn exactly symmetrically; even if the layout is drawn symmetrically, patterns may not be formed identically; and contacts may not be defined identically.

Figure 2:
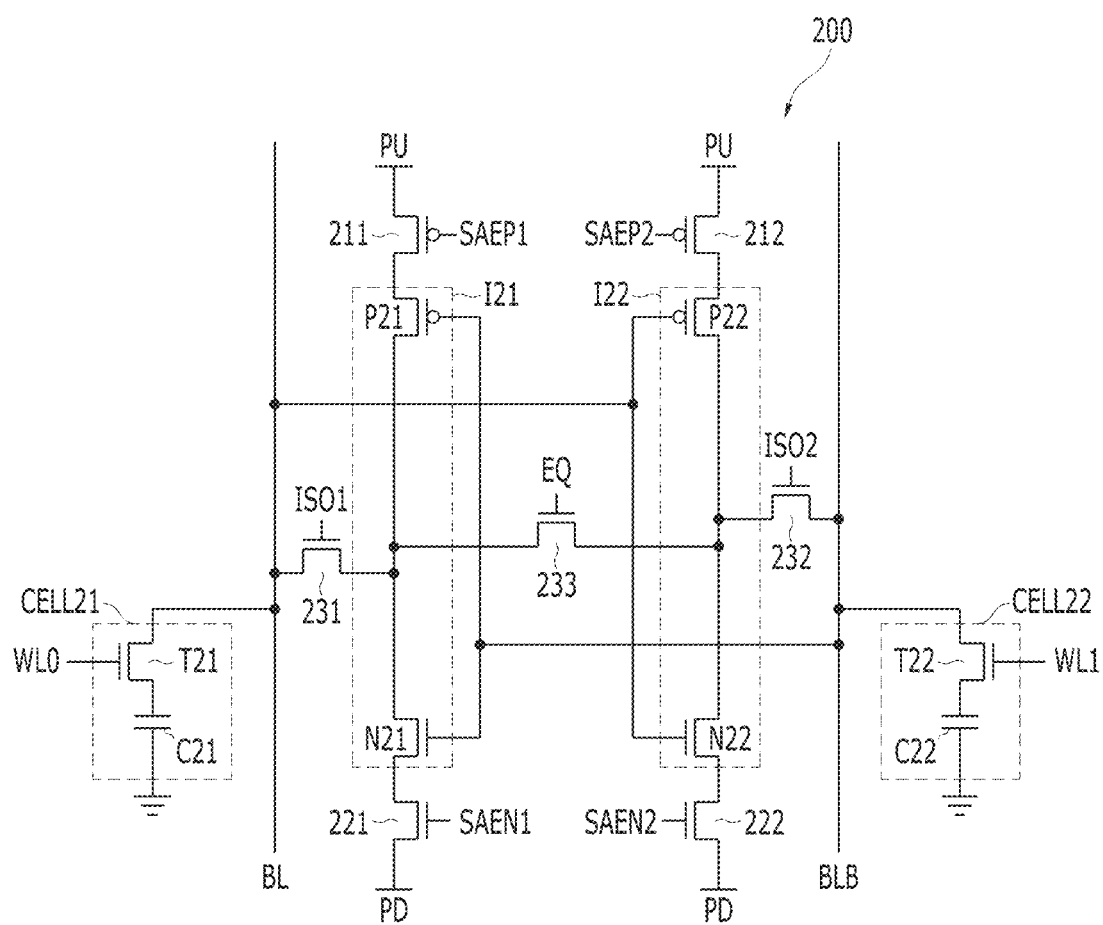
FIG. 2 is a schematic diagram illustrating a bit line sense amplifier in accordance with a second embodiment of the present invention.

FIG. 2 is a schematic diagram illustrating a bit line sense amplifier 200 in accordance with a second embodiment of the present invention.

Referring to FIG. 2, the bit line sense amplifier 200 may include a first inverter I21, a second inverter I22, a first pull-up voltage supplier 211, a second pull-up voltage supplier 212, a first pull-down voltage supplier 221, a second pull-down voltage supplier 222, a first isolation switch 231, a second isolation switch 232, and an equalizing switch 233. For the sake of convenience in description, a memory cell CELL21 on the side of a bit line BL and a memory cell CELL22 on the side of a bit line bar BLB are illustrated along with the bit line sense amplifier 200.

In accordance with one embodiment, the first inverter I21 and the second inverter I22 may respectively include PMOS transistors P21 and P22 and NMOS transistors N21 and N22. The first inverter I21 and the second inverter I22 may be coupled in a cross-coupled form, that is, a latched form, and perform an amplifier operation.

The first pull-up voltage supplier 211 may supply a pull-up voltage PU to the first inverter I21 in response to a first pull-up voltage supplying signal SAEP1. The second pull-up voltage supplier 212 may supply a pull-up voltage PU to the second inverter I22 in response to a second pull-up voltage supplying signal SAEP2. The first pull-down voltage supplier 221 may supply a pull-down voltage PD to the first inverter I21 in response to a first pull-down voltage supplying signal SAEN1. The second pull-down voltage supplier 222 may supply a pull-down voltage PD to the second inverter I22 in response to a second pull-down voltage supplying signal SAEN2. As for the pull-up voltage PU, a power source voltage VDD or a core voltage VCORE (obtained by down-converting the power source voltage VDD) may be used. As for the pull-down voltage PD, a ground voltage may be used. Each of the first pull-up voltage supplier 211 and the second pull-up voltage supplier 212 may include a PMOS transistor, and each of the first pull-down voltage supplier 221 and the second pull-down voltage supplier 222 may include an NMOS transistor. The first inverter I21 may receive power from the first pull-up voltage supplier 211 and the first pull-down voltage supplier 221, and the second inverter I22 may receive power from the second pull-up voltage supplier 212 and the second pull-down voltage supplier 222. Therefore, the first inverter I21 and the second inverter I22 may receive power independently. In other words, the first inverter I21 and the second inverter I22 may be enabled and disabled independently. Although FIG. 2 illustrates, as an example, that the first pull-up voltage supplier 211 and the second pull-up voltage supplier 212 each including a PMOS transistor, it is to be noted that the present embodiment is not limited thereto, and that each of the first pull-up voltage supplier 211 and the second pull-up voltage supplier 212 may include an NMOS transistor.

The first isolation switch 231 may electrically connect or disconnect the bit line BL and an output terminal of the first inverter I21 to or from each other in response to a first isolation signal ISO1. The second isolation switch 232 may electrically connect or disconnect the bit line bar BLB and an output terminal of the second inverter I22 to or from each other in response to a second isolation signal ISO2. The equalizing switch 233 may electrically connect or disconnect the output terminal of the first inverter I21 and the output terminal of the second inverter I22 to or from each other in response to an equalizing signal EQ. Each of the first isolation switch 231, the second isolation switch 232, and the equalizing switch 233 may include an NMOS transistor.

Figure 3:
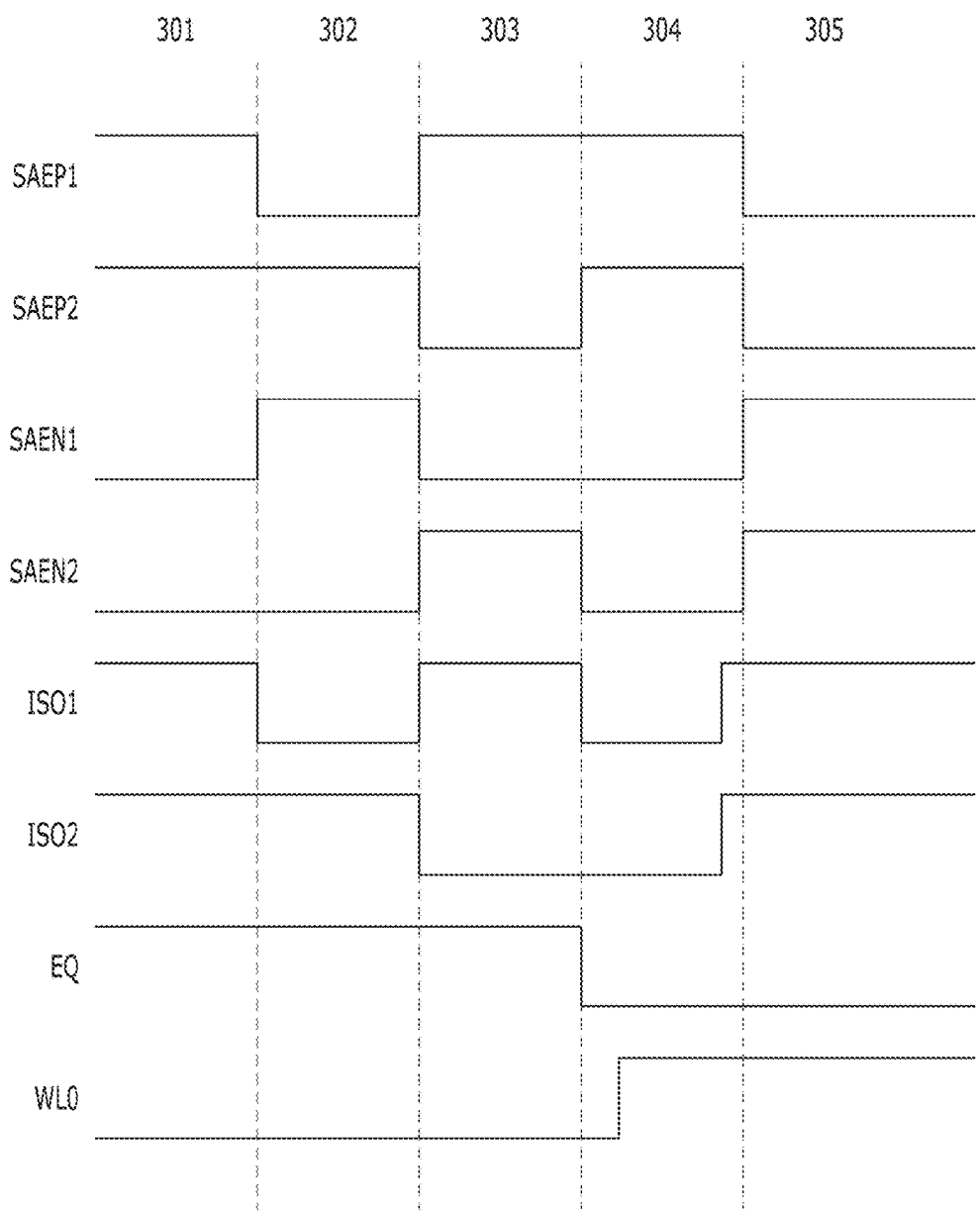
FIG. 3 is a timing diagram describing how various signals are controlled while the bit line sense amplifier of FIG. 2 senses data in a memory cell.
Figure 4:
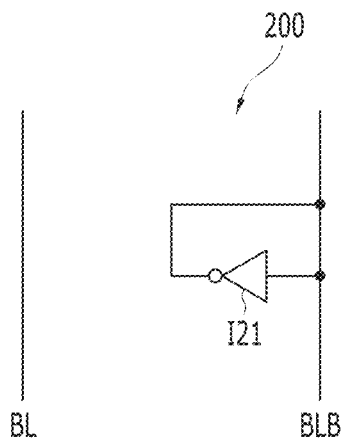
FIG. 4 illustrates an electrical connection status of the bit line sense amplifier of FIG. 2 in a first offset compensation operation section.
Figure 5:
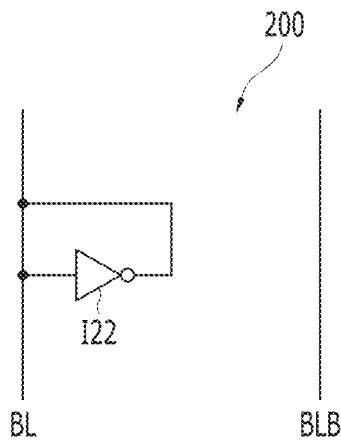
FIG. 5 illustrates an electrical connection status of the bit line sense amplifier of FIG. 2 in a second offset compensation operation section.

FIG. 3 is a timing diagram describing how signals SAEP1, SAEP2, SAEN1, SAEN2, ISO1, ISO2, and EQ are controlled while the bit line sense amplifier 200 (shown in FIG. 2) senses data in the memory cell CELL21 (shown in FIG. 2). FIG. 4 illustrates an electrical connection status of the bit line sense amplifier 200 (shown in FIG. 2) in a first offset compensation operation section 302. FIG. 5 illustrates an electrical connection status of the bit line sense amplifier 200 (shown in FIG. 2) in a second offset compensation operation section 303. While describing an operation of the bit line sense amplifier 200, references will be made to FIGS. 2 to 5.

First, in a first pre-charge operation section 301 for pre-charging the bit line BL and the bit line bar BLB with the same level, the first inverter I21 may be disabled as the first pull-up voltage supplying signal SAEP1 is disabled to a logic high level, and the first pull-down voltage supplying signal SAEN1 is disabled to a logic low level. Further in the first pre-charge operation section 301, the second inverter I22 may also be disabled as the second pull-up voltage supplying signal SAEP2 is disabled to a logic high level, and the second pull-down voltage supplying signal SAEN2 is disabled to a logic low level. As the first isolation signal ISO1, the second isolation signal ISO2, and the equalizing signal EQ are enabled to a logic high level (as a result, the first isolation switch 231, the second isolation switch 232, and the equalizing switch 233 are turned on), the bit line BL and the bit line bar BLB may be pre-charged with the same voltage level. Within the first pre-charge operation section 301, a pre-charge circuit (not shown) may supply a pre-charge voltage of an intermediate level between the pull-up voltage PU and the pull-down voltage PD to the bit line BL and the bit line bar BLB.

In a first offset compensation operation section 302 for compensating for the offset of the first inverter I21, the first inverter I21 may be enabled as the first pull-up voltage supplying signal SAEP1 is enabled to a logic low level, and the first pull-down voltage supplying signal SAEN1 is enabled to a logic high level. Further, the second inverter I22 may be disabled as the second pull-up voltage supplying signal SAEP2 is disabled to a logic high level, and the second pull-down voltage supplying signal SAEN2 is disabled to a logic low level. Since the second isolation signal ISO2 and the equalizing signal EQ are enabled to a logic high level, and the first isolation signal ISO1 is disabled to a logic low level, the second isolation switch 232 and the equalizing switch 233 may be turned on, and the first isolation switch 231 may be turned off. As a result, the input terminal and the output terminal of the first inverter I21 may be coupled to the bit line bar BLB. In short, the bit line sense amplifier 200 may be as shown in FIG. 4 in the first offset compensation operation section 302. Since the input terminal and the output terminal of the first inverter I21 are all coupled to the bit line bar BLB in the first offset compensation operation section 302, a type of an equilibrium state of the first inverter I21 reflecting the offset value of the transistors P21 and N21 in the inside of the first inverter I21 may be stored in the bit line bar BLB.

In a second offset compensation operation section 303 for compensating for the offset of the second inverter I22, the second pull-up voltage supplying signal SAEP2 may be enabled to a logic low level, and the second pull-down voltage supplying signal SAEN2 may be enabled to a logic high level so as to enable the second inverter I22, while the first pull-up voltage supplying signal SAEP1 may be disabled to a logic high level, and the first pull-down voltage supplying signal SAEN1 may be disabled to a logic low level so as to disable the first inverter I21. As the first isolation signal ISO1 and the equalizing signal EQ are enabled to a logic high level, and the second isolation signal ISO2 is disabled to a logic low level, the first isolation switch 231 and the equalizing switch 233 may be turned on, and the second isolation switch 232 may be turned off. As a result, the input terminal and the output terminal of the second inverter I22 may be coupled to the bit line BL. In short, the bit line sense amplifier 200 may be as shown in FIG. 5 in the second offset compensation operation section 303. Since the input terminal and the output terminal of the second inverter I22 are all coupled to the bit line BL in the second offset compensation operation section 303, a type of an equilibrium state of the second inverter I22 reflecting the offset of the transistors P22 and N22 in the inside of the second inverter I22 may be stored in the bit line BL.

Then, a charge sharing operation section 304 may begin following the first offset compensation operation section 302 and the second offset compensation operation section 303. In the charge sharing operation section 304, the first inverter I21 and the second inverter I22 may be all disabled, and when the $0^{th}$ word line WL0 is enabled while the first isolation switch 231, the second isolation switch 232, and the equalizing switch 233 are all turned off, a charge sharing operation where data stored in a capacitor C21 flows to the bit line BL through the channel of a cell transistor T21 of the memory cell CELL21 coupled to the $0^{th}$ word line WL0 may be performed. By the charge sharing operation, the voltage level of the bit line BL may become a bit higher or lower than the equilibrium state obtained from the first offset compensation operation. At the end of the charge sharing operation section 304, the first isolation switch 231 and the second isolation switch 232 may be turned on to couple the bit line pair BL and BLB with the inverters I21 and I22, respectively. Herein, the embodiment in which the $0^{th}$ word line WL0 is enabled, and the data of the memory cell CELL21 is charge-shared to the bit line BL is an example of various implementations of the present invention. Thus, one skilled in the art will appreciate that a first word line WL1 may be enabled, and data in a memory cell CELL22 may be charge-shared to the bit line bar BLB in one exemplary embodiment.

Subsequently, an amplification operation may be performed. In an amplification operation section 305, the first isolation switch 231 and the second isolation switch 232 are turned on. Further, the first pull-up voltage supplying signal SAEP1 may be enabled to a logic low level, and the first pull-down voltage supplying signal SAEN1 may be enabled to a logic high level so as to enable the first inverter I21, while the second pull-up voltage supplying signal SAEP2 may be enabled to a logic low level, and the second pull-down voltage supplying signal SAEN2 may be enabled to a logic high level so as to enable the second inverter I22. Thus, the voltage difference between the bit line BL and the bit line bar BLB may be amplified.

Since a charge sharing operation and an amplification operation are performed, after an equilibrium state reflecting the offset of the first inverter I21 may be stored in the bit line BL through a first offset compensation operation, and also after an equilibrium state reflecting the offset of the second inverter I22 may be stored in the bit line bar BLB through a second offset compensation operation, the bit line sense amplifier 200 may perform the amplification operation accurately. In short, the offset voltage for securing an accurate operation of the bit line sense amplifier 200 may be reduced.

Figure 6:
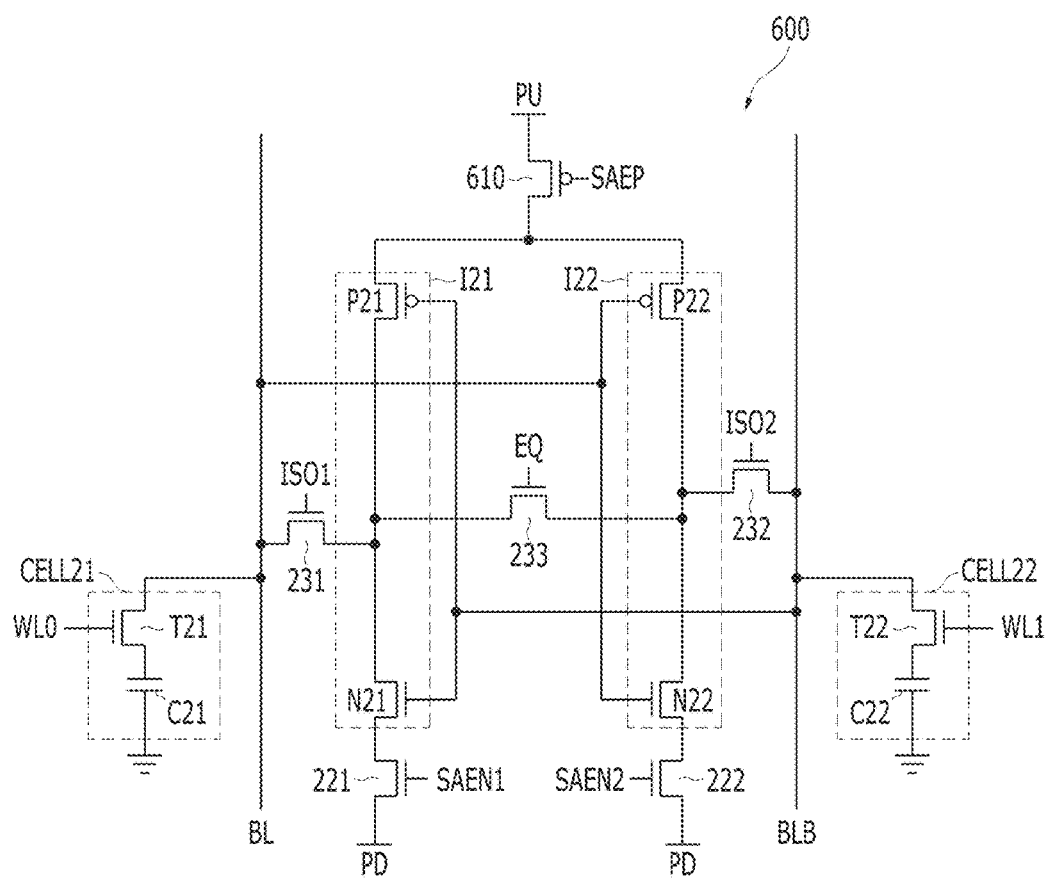
FIG. 6 is a schematic diagram illustrating a bit line sense amplifier in accordance with a third embodiment of the present invention.

FIG. 6 is a schematic diagram illustrating a bit line sense amplifier 600 in accordance with a third embodiment of the present invention.

Referring to FIG. 6, the bit line sense amplifier 600 may include a pull-up voltage supplier 610, which replaces a combination of the first pull-up voltage supplier 211 and the second pull-up voltage supplier 212 shown in FIG. 2. Although the pull-up voltage supplier 610 is coupled in common to the first inverter I21 and the second inverter I22, the first inverter I21 and the second inverter I22 may be enabled and disabled independently, since the first pull-down voltage supplier 221 and the second pull-down voltage supplier 222 are provided for the first inverter I21 and the second inverter I22, respectively. For example, the pull-up voltage PU may be supplied to the first inverter I21 and the second inverter I22, and the pull-down voltage PD may be supplied only to the first inverter I21, and the pull-down voltage PD may not be supplied to the second inverter I22. In this way, the first inverter I21 may be enabled, while the second inverter I22 may be disabled. Herein, the embodiment in which the pull-up voltage supplier 610 includes a PMOS transistor is exemplarily illustrated, and the pull-up voltage supplier 610 may instead include an NMOS transistor according to one exemplary embodiment.

The signals SAEN1, SAEN2, ISO1, ISO2, and EQ for controlling the operation of the bit line sense amplifier 600 may be controlled in the same way shown in FIG. 3. A pull-up voltage supplying signal SAEP of FIG. 6 may be enabled to a logic low level in a section where one or more of the first pull-up voltage supplying signal SAEP1 and the second pull-up voltage supplying signal SAEP2 are enabled to a logic low level in FIG. 3, and be disabled to a logic high level in a section where all the first pull-up voltage supplying signal SAEP1 and the second pull-up voltage supplying signal SAEP2 are disabled to a logic high level.

Figure 7:
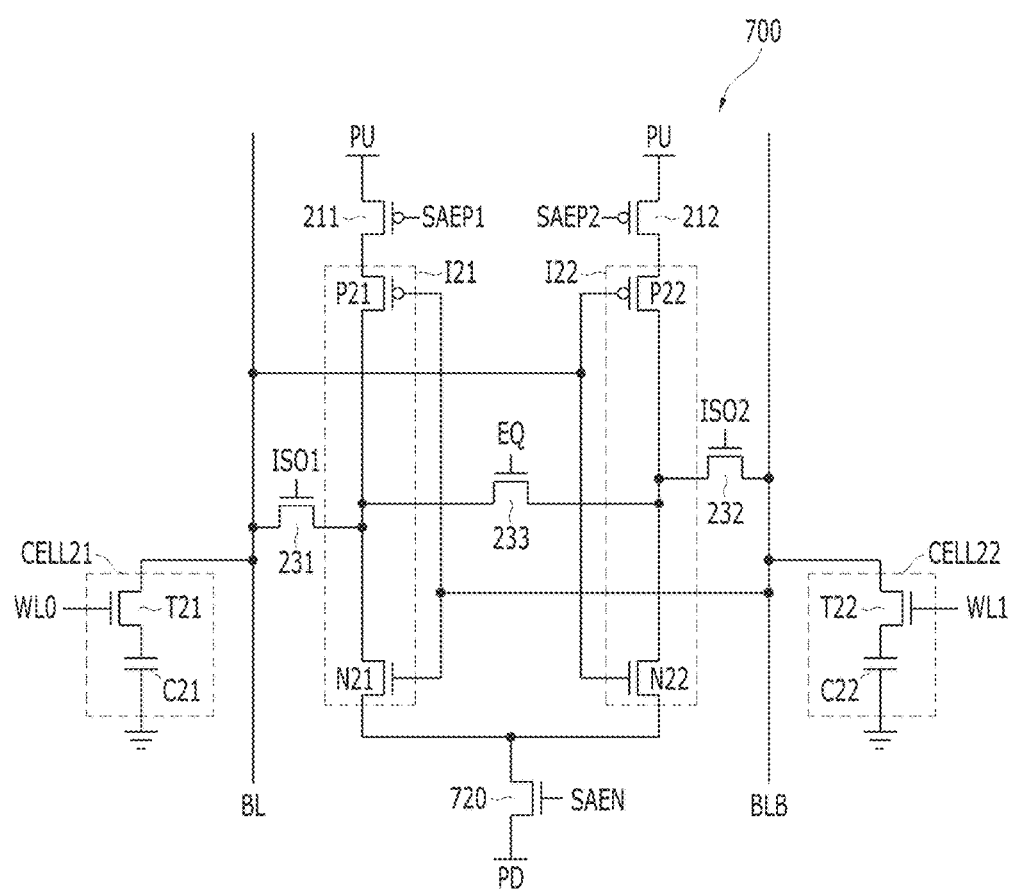
FIG. 7 is a schematic diagram illustrating a bit line sense amplifier in accordance with a fourth embodiment of the present invention.

FIG. 7 is a schematic diagram illustrating a bit line sense amplifier 700 in accordance with a fourth embodiment of the present invention.

Referring to FIG. 7, the bit line sense amplifier 700 may include a pull-down voltage supplier 720, which replaces a combination of the first pull-down voltage supplier 221 and the second pull-down voltage supplier 222 shown in FIG. 2. Although the pull-down voltage supplier 720 is coupled in common to the first inverter I21 and the second inverter I22, the first inverter I21 and the second inverter I22 may be enabled and disabled independently, since the first pull-up voltage supplier 211 and the second pull-up voltage supplier 212 are provided for the first inverter I21 and the second inverter I22, respectively. For example, the pull-down voltage PD may be supplied to the first inverter I21 and the second inverter I22, while the pull-up voltage PU may be supplied only to the first inverter I21 and may not be supplied to the second inverter I22. In this way, the first inverter I21 may be enabled and the second inverter I22 may be disabled.

The signals SAEP1, SAEP2, ISO1, ISO2, and EQ for controlling the operation of the bit line sense amplifier 700 may be controlled in the same way shown in FIG. 3. A pull-down voltage supplying signal SAEN of FIG. 7 may be enabled to a logic high level in a section where one or more of the first pull-down voltage supplying signal SAEN1 and the second pull-down voltage supplying signal SAEN2 are enabled to a logic high level in FIG. 3, and be disabled to a logic low level in a section where all the first pull-down voltage supplying signal SAEN1 and the second pull-down voltage supplying signal SAEN2 are disabled to a logic low level.

Figure 8:
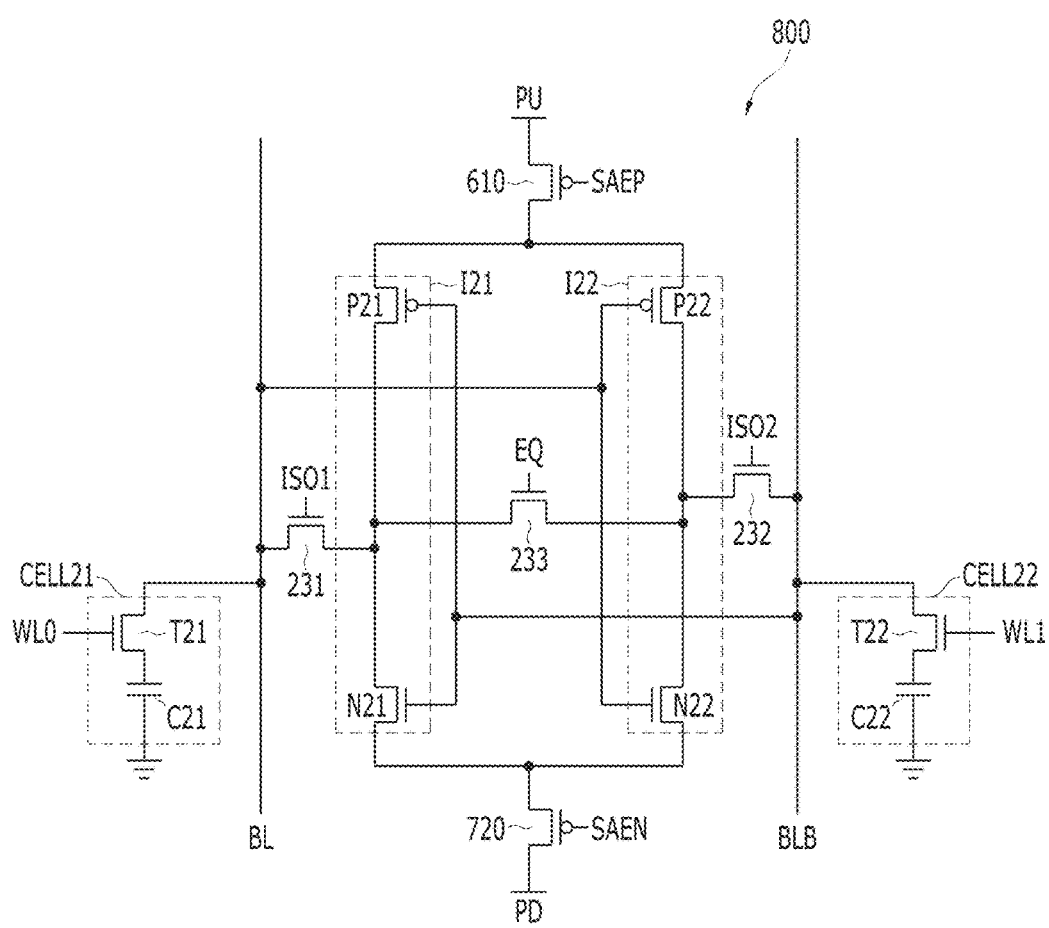
FIG. 8 is a schematic diagram illustrating a bit line sense amplifier in accordance with a fifth embodiment of the present invention.

FIG. 8 is a schematic diagram illustrating a bit line sense amplifier 800 in accordance with a fifth embodiment of the present invention.

Referring to FIG. 8, the bit line sense amplifier 800 may include a pull-up voltage supplier 610 of FIG. 6 and a pull-down voltage supplier 720 of FIG. 7. The signals ISO1, ISO2, and EQ for controlling the bit line sense amplifier 800 may be controlled in the same way shown in FIG. 3. A pull-up voltage supplying signal SAEP may be enabled to a logic low level in a section where one or more of the first pull-up voltage supplying signal SAEP1 and the second pull-up voltage supplying signal SAEP2 are enabled to a logic low level in FIG. 3, and be disabled to a logic high level in a section where all the first pull-up voltage supplying signal SAEP1 and the second pull-up voltage supplying signal SAEP2 are disabled to a logic high level.

In the bit line sense amplifier 800, since all the first inverter I21 and the second inverter I22 are enabled in the first offset compensation operation section 302 and the second offset compensation operation section 303, the effect of the offset compensation operation may not be as great as in the previous embodiments. However, since the bit line sense amplifier 800 does not have to separately control the first inverter I21 and the second inverter I22, the structure of the bit line sense amplifier 800 may be further simplified.

Figure 9:
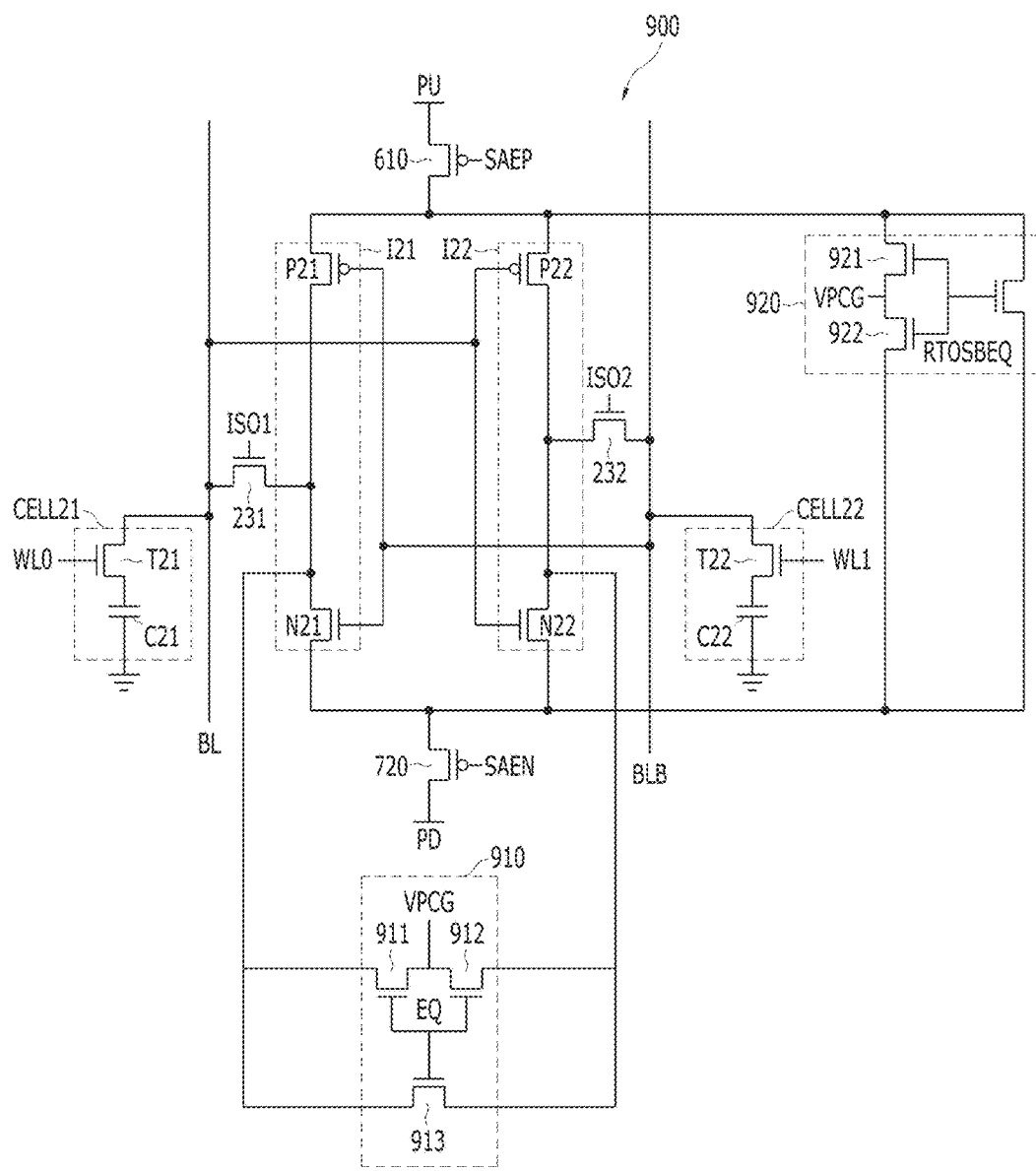
FIG. 9 is a schematic diagram illustrating a bit line sense amplifier in accordance with a sixth embodiment of the present invention.

FIG. 9 is a schematic diagram illustrating a bit line sense amplifier 900 in accordance with a sixth embodiment of the present invention. The bit line sense amplifier 900 may be the bit line sense amplifier 800 of FIG. 8 excluding the equalizing switch 233 and further including a first pre-charge circuit 910 and a second pre-charge circuit 920.

The first pre-charge circuit 910 may supply a pre-charge voltage VPCG to the output terminal of the first inverter I21 and the output terminal of the second inverter I22 in response to the equalizing signal EQ. The pre-charge voltage VPCG may have an intermediate level between the pull-up voltage PU and a pull-down voltage PD. The first pre-charge circuit 910 may include an NMOS transistor 911 for supplying the pre-charge voltage VPCG to the output terminal of the first inverter I21 in response to the equalizing signal EQ, an NMOS transistor 912 for supplying the pre-charge voltage VPCG to the output terminal of the second inverter I22 in response to the equalizing signal EQ, and an NMOS transistor 913 for electrically connecting the output terminal of the first inverter I21 and the output terminal of the second inverter I22 to each other in response to the equalizing signal EQ.

The second pre-charge circuit 920 may supply the pre-charge voltage VPCG to pull-up terminals of the first inverter I21 and the second inverter I22 and pull-down terminals of the first inverter I21 and the second inverter I22 in response to a voltage terminal equalizing signal RTOSBEQ. The second pre-charge circuit 920 may include an NMOS transistor 921 for supplying the pre-charge voltage VPCG to the pull-up terminals of the first inverter I21 and the second inverter I22 in response to the voltage terminal equalizing signal RTOSBEQ, an NMOS transistor 922 for supplying the pre-charge voltage VPCG to the pull-down terminals of the first inverter I21 and the second inverter I22 in response to the voltage terminal equalizing signal RTOSBEQ, and an NMOS transistor 923 for electrically connecting the pull-up terminals of the first inverter I21 and the second inverter I22 and the pull-down terminals of the first inverter I21 and the second inverter I22 to each other in response to the voltage terminal equalizing signal RTOSBEQ.

The signals ISO1, ISO2, and EQ for controlling the bit line sense amplifier 900 may be controlled in the same way shown in FIG. 3. A pull-up voltage supplying signal SAEP may be enabled to a logic low level in a section where one or more of the first pull-up voltage supplying signal SAEP1 and the second pull-up voltage supplying signal SAEP2 are enabled to a logic low level in FIG. 3, and be disabled to a logic high level in a section where all the first pull-up voltage supplying signal SAEP1 and the second pull-up voltage supplying signal SAEP2 are disabled to a logic high level. Also, the voltage terminal equalizing signal RTOSBEQ may be enabled to a logic high level in a section where the pull-up voltage supplying signal SAEP and the pull-down voltage supplying signal SAEN are disabled.

The bit line sense amplifier 900 may operate in the same manner as that of the bit line sense amplifier 800 of FIG. 8, except for the fact that when the equalizing signal EQ is enabled, not only are the output terminal of the first inverter I21 and the output terminal of the second inverter I22 electrically connected to each other, but also the pre-charge voltage VPCG is supplied to the output terminal of the first inverter I21 and the output terminal of the second inverter I22. Furthermore, the bit line sense amplifier 900 and the bit line sense amplifier 800 differ in that when the first inverter I21 and the second inverter I22 are disabled, the pull-up terminals and the pull-down terminals of the first inverter I21 and the second inverter I22 are pre-charged with the pre-charge voltage VPCG.

According to various exemplary embodiments of the present invention, the offset of an amplifier circuit may be reduced.

While the present invention has been described with respect to the specific embodiments, it will be apparent to those skilled in the art that various changes and modifications may be made without departing from the spirit and scope of the invention as defined in the following claims.

What is claimed is:

1. An amplifier circuit, comprising:
a first inverter and a second inverter coupled in a cross-coupled form during an amplification operation and suitable for amplifying a voltage difference between a first line and a second line;
a first isolation switch suitable for electrically connecting the first line and an output terminal of the first inverter to each other;
a second isolation switch suitable for electrically connecting the second line and an output terminal of the second inverter to each other; and
an equalizing switch suitable for electrically connecting the output terminal of the first inverter and the output terminal of the second inverter to each other,
wherein before the amplification operation, a first offset compensation operation for turning on the second isolation switch and the equalizing switch and a second offset compensation operation for turning on the first isolation switch and the equalizing switch are performed.

2. The amplifier circuit of claim 1, wherein the first inverter is enabled, and the second inverter is disabled during the first offset compensation operation, and
wherein the second inverter is enabled, and the first inverter is disabled during the second offset compensation operation.

3. The amplifier circuit of claim 2, wherein before the first offset compensation operation and the second offset compensation operation,
a pre-charge operation in which the first inverter and the second inverter are disabled and in which the first isolation switch, the second isolation switch, and the equalizing switch are turned on is performed.

4. The amplifier circuit of claim 3, wherein during the amplification operation,
the first inverter and the second inverter are enabled, and the first isolation switch and the second isolation switch are turned on.

5. The amplifier circuit of claim 3, wherein the amplifier circuit is a bit line sense amplifier, and
the first line is a bit line, and the second line is a bit line bar.

6. The amplifier circuit of claim 5, wherein before the amplification operation is performed and after the first offset compensation operation and the second offset compensation operation are performed,
a charge sharing operation where data of a selected memory cell is transferred through either one of the bit line and the bit line bar is performed.

7. The amplifier circuit of claim 6, wherein during the charge sharing operation,
the first inverter and the second inverter are disabled, and the first isolation switch, the second isolation switch, and the equalizing switch are turned off.

8. The amplifier circuit of claim 4, wherein each of the first inverter and the second inverter is enabled in response to receiving a pull-up voltage and a pull-down voltage, and
the first inverter and the second inverter are disabled when one or more of the pull-up voltage and the pull-down voltage are cut off.

9. The amplifier circuit of claim 8, further comprising:
a first pull-up switch suitable for supplying the pull-up voltage to the first inverter;
a first pull-down switch suitable for supplying the pull-down voltage to the first inverter;
a second pull-up switch suitable for supplying the pull-up voltage to the second inverter; and
a second pull-down switch suitable for supplying the pull-down voltage to the second inverter,
wherein when the first pull-up switch and the first pull-down switch are turned on, the first inverter is enabled, and
when the second pull-up switch and the second pull-down switch are turned on, the second inverter is enabled.

10. The amplifier circuit of claim 8, further comprising:
a pull-up switch suitable for supplying the pull-up voltage to the first inverter and the second inverter;
a first pull-down switch suitable for supplying the pull-down voltage to the first inverter; and
a second pull-down switch suitable for supplying the pull-down voltage to the second inverter,
wherein when the pull-up switch and the first pull-down switch are turned on, the first inverter is enabled, and
when the pull-up switch and the second pull-down switch are turned on, the second inverter is enabled.

11. The amplifier circuit of claim 8, further comprising:
a first pull-up switch suitable for supplying the pull-up voltage to the first inverter;
a second pull-up switch suitable for supplying the pull-up voltage to the second inverter; and
a pull-down switch suitable for supplying the pull-down voltage to the first inverter and the second inverter,
wherein when the first pull-up switch and the pull-down switch are turned on, the first inverter is enabled, and
when the second pull-up switch and the pull-down switch are turned on, the second inverter is enabled.

12. An amplifier circuit, comprising:
a first inverter and a second inverter coupled in a cross-coupled form during an amplification operation and suitable for amplifying a voltage difference between a first line and a second line,
wherein before the amplification operation, a first offset compensation operation for electrically connecting an input terminal and an output terminal of the first inverter to the second line and a second offset compensation operation for electrically connecting an input terminal and an output terminal of the second inverter to the first line are performed.

13. The amplifier circuit of claim 12, wherein the first inverter is enabled during the first offset compensation operation, and
the second inverter is enabled during the second offset compensation operation.

14. The amplifier circuit of claim 13, wherein before the first offset compensation operation and the second offset compensation operation,
a pre-charge operation in which the first line and the second line are electrically connected to each other is performed while the first inverter and the second inverter are disabled.

15. The amplifier circuit of claim 13, wherein the first inverter and the first line are electrically disconnected from each other during the first offset compensation operation, and
the second inverter and the second line are electrically disconnected from each other during the second offset compensation operation.

16. The amplifier circuit of claim 13, wherein before the amplification operation is performed and after the first offset compensation operation and the second offset compensation operation are performed,
a signal for amplification is transferred through at least one of the first line and the second line.

17. An amplifier circuit, comprising:
a first inverter and a second inverter coupled in a cross-coupled form during an amplification operation and suitable for amplifying a voltage difference between a first line and a second line;
a first isolation switch suitable for electrically connecting the first line and an output terminal of the first inverter to each other;
a second isolation switch suitable for electrically connecting the second line and an output terminal of the second inverter to each other; and
a first pre-charge circuit suitable for applying a pre-charge voltage to the output terminal of the first inverter and the output terminal of the second inverter and for electrically connecting the output terminal of the first inverter and the output terminal of the second inverter to each other,
wherein before the amplification operation, a first offset compensation operation for turning on the second isolation switch and enabling the first pre-charge circuit and a second offset compensation operation for turning on the first isolation switch and enabling the first pre-charge circuit are performed.

18. The amplifier circuit of claim 17, further comprising:
a second pre-charge circuit suitable for applying the pre-charge voltage to a common pull-up terminal of the first inverter and the second inverter and a common pull-down terminal of the first inverter and the second inverter, and for electrically connecting the common pull-up terminal and the common pull-down terminal to each other.

19. The amplifier circuit of claim 18, wherein during the first offset compensation operation and the second offset compensation operation, the first inverter and the second inverter are enabled, and
wherein the second pre-charge circuit is enabled when the first inverter and the second inverter are disabled.

* * * * *